US008080775B2

(12) United States Patent
Veeder

(10) Patent No.: US 8,080,775 B2
(45) Date of Patent: Dec. 20, 2011

(54) DIFFERENTIAL SOURCE FOLLOWER SOURCE LEADER ADDRESSABLE NODE READOUT CIRCUIT

(75) Inventor: Kenton T. Veeder, Burlington, MA (US)

(73) Assignee: Raytheon Company, Waltham, MA (US)

( * ) Notice: Subject to any disclaimer, the term of this patent is extended or adjusted under 35 U.S.C. 154(b) by 171 days.

(21) Appl. No.: 12/165,077

(22) Filed: Jun. 30, 2008

(65) Prior Publication Data
US 2009/0321613 A1 Dec. 31, 2009

(51) Int. Cl.
*H01J 40/14* (2006.01)
*H01L 27/00* (2006.01)
(52) U.S. Cl. ............................ 250/214 R; 250/208.1
(58) Field of Classification Search .......... 348/300, 348/301; 330/308, 252; 398/202, 206, 209, 398/213; 327/514, 515; 250/208.1, 214 R, 250/214 A, 214.1
See application file for complete search history.

(56) References Cited

U.S. PATENT DOCUMENTS

| 6,084,229 | A | * | 7/2000 | Pace et al. ............... | 250/208.1 |
| 7,133,074 | B1 | * | 11/2006 | Brehmer et al. .......... | 348/308 |
| 7,442,913 | B2 | * | 10/2008 | Fukuda et al. ............ | 250/214 A |
| 2007/0139115 | A1 | | 6/2007 | Forbes et al. | |
| 2007/0182482 | A1 | | 8/2007 | Forbes et al. | |

FOREIGN PATENT DOCUMENTS

JP 59216306 A 12/1984

OTHER PUBLICATIONS

Sakakibara, et al., "A High-Sensitivity CMOS Image Sensor With Gain-Adaptive Column Amplifiers"; IEEE J. Solid-State Circuits, vol. 40, No. 5, pp. 1147-1156, May 2005.
Tian, et al., "Analysis of Temporal Noise in CMOS Photodiode Active Pixel Sensor", IEEE J. Solid-State Circuits, vol. 36, No. 1, pp. 92-101, Jan. 2001.
Labonne, et al., "A 120dB CMOS Imager with a Light Adaptive System and Digital Outputs", IEEE Publications, pp. 269-272, Jun. 2006.
International Search Report and Written Opinion mailed Feb. 24, 2010.

* cited by examiner

*Primary Examiner* — Georgia Y Epps
*Assistant Examiner* — Pascal M Bui Pho
(74) *Attorney, Agent, or Firm* — Glenn H. Lenzen; Husch Blackwell LLP

(57) ABSTRACT

A readout circuit for reading from addressable nodes comprises first and second half-circuits of a differential amplifier. The first half-circuit comprises at least one source follower transistor adapted to receive an input signal from one of the addressable nodes, such as pixel readouts of an imaging system. The first half-circuit further comprises a row selector switch coupled to the source follower transistor to selectively activate the source follower transistor to receive the input signal. The second half-circuit comprises an output node for providing an output signal of a readout of a selected addressable node. The second half-circuit further comprises a source leader transistor coupled to the output node to provide a feedback signal based on the readout. A feedback loop is connected to the source leader transistor to provide feedback from the output node for utilization in a differential amplification of the input signal.

21 Claims, 6 Drawing Sheets

DIFFERENTIAL SOURCE FOLLOWER SOURCE LEADER ADDRESSABLE NODE READOUT CIRCUIT

This invention was made with the United States Government support under Contract No. FA9453-05-C-0232 awarded by AFRL. The Government has certain rights in this invention.

FIELD

This invention relates generally to the field of reading data from addressable nodes, and more particularly, to pixel readouts for digital imaging systems.

BACKGROUND

Imaging systems, such as complementary metal oxide semiconductor (CMOS) imagers, are used in various imaging devices such as image sensors used in digital cameras, camcorders and other electronic products. A typical CMOS imager includes an array or matrix of pixel cells. Each pixel cell includes a photoconversion device for generating and accumulating a charge responsive to light shining on the photoconversion device. The light shining upon the pixel cell corresponds to an element of the overall picture, and the resulting electrical signal corresponds to the signal generating pixel's portion of the image. A pixel readout circuit is coupled to the photoconversion device, and provides a pixel readout of the photoconversion device.

A source follower readout circuit is a common configuration for a pixel readout circuit. The source follower readout circuit includes a source follower transistor having its gate (G) coupled to a photoconversion device, and its source (S) coupled to a row selector. The row selector provides selective activation of the source follower transistor. A bias transistor acts as a current source to pull current through the source follower transistor once the row selector switch is closed. An output node of the circuit is coupled to the source (S) of the source follower transistor, and provides an output signal representing the pixel readout.

Conventional source follower circuits have a variety of problems. First, there are sources of noise in the source follower circuits that are injected into the output signal. The bias source is one potential source of noise in a source follower circuit. Source follower circuits are unable to provide common-mode rejection to cancel this bias noise and other noise from the output signal. This results in a less than optimal pixel readout from the pixel readout circuit.

Additionally, there is a gain degradation in source follower circuits, which leads to a significant loss of the pixel readout. As imaging systems become smaller and more densely populated with components, the transistors in these imaging systems also become smaller. As a result, the output signals provided by these transistors also become smaller in magnitude and slight variations in voltages can cause significant signal losses, which can potentially affect the quality of the image recorded by the imaging system. Similar types of source follower readout circuits are utilized for reading from other types of addressable nodes, such as locations of memory in memory storage devices. These circuits also have similar noise and gain degradation problems.

In view of these problems, there is a need in the art for readout circuits for addressable nodes that overcome one or more of the technical problems as stated above.

SUMMARY

A differential source follower source leader is adapted to read from addressable nodes. This circuit also provides common-mode rejection which significantly reduces noise in the output signal and improves the quality of the readout from the addressable nodes.

In particular, and by way of example only, according to one embodiment of the present invention, provided is a differential source follower source leader readout circuit adapted to read from addressable nodes that comprises first and second half-circuits of a differential amplifier. The first half-circuit includes at least one source follower transistor adapted to receive an input signal through its gate from one of the addressable nodes. In exemplary embodiments, the addressable nodes comprise pixel readouts of an imaging system, or memory locations of a memory storage device. The first half-circuit also includes a selector switch coupled to the source follower transistor adapted to selectively activate the source follower transistor to receive the input signal. The second half-circuit comprises an output node for providing an output signal of a readout of a selected addressable node. The second half-circuit also includes a source leader transistor coupled to the output node adapted to provide a feedback signal based on the readout. A feedback loop is connected to the source leader transistor to provide feedback from the output node.

Another illustrative embodiment of the invention includes a pixel readout circuit comprising an input node in electrical communication with a photoconversion device. The pixel readout circuit also includes a differential amplifier with a first input in electrical communication with the input node, and a second input in electrical communication with a feedback loop connected to the output node. The output node provides a pixel readout circuit of the photoconversion device, and the pixel readout signal is fed back into the pixel readout through the feedback loop to allow utilization of the differential amplifier structure. The differential amplifier structure decreases the gain degradation in the pixel readout circuit so that the voltage of the output signal is almost equal to the voltage of the input signal from the photoconversion device.

A method for reading from a matrix of addressable nodes (such as photoconversion devices of an imaging system) in an illustrative embodiment includes the steps of: providing a first half-circuit of a differential amplifier comprising at least one source follower transistor adapted to receive an input signal through its gate from one of the addressable nodes; providing a second half-circuit of a differential amplifier comprising: an output node adapted to provide an output signal of a readout of one of the addressable nodes, and a source leader transistor coupled to the output node adapted to provide a feedback signal based on the readout, the source leader transistor connected to a feedback loop in electrical communication with the output node; providing a tail current source in electrical communication with the source follower transistor and the source leader transistor; and operating a selector switch coupled to the source follower transistor to selectively activate the source follower transistor to receive the input signal.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

DETAILED DESCRIPTION

Before proceeding with the detailed description, it is to be appreciated that the present teaching is by way of example only, not by limitation. The concepts herein are not limited to use or application with a specific type of readout circuit or method of reading from a matrix of addressable nodes attached to a readout circuit. Thus, although the instrumentalities described herein are for the convenience of explanation, shown and described with respect to exemplary embodiments, it will be appreciated that the principles herein may be applied equally in other types of readout circuits and methodologies for reading from addressable nodes.

Figure 1:
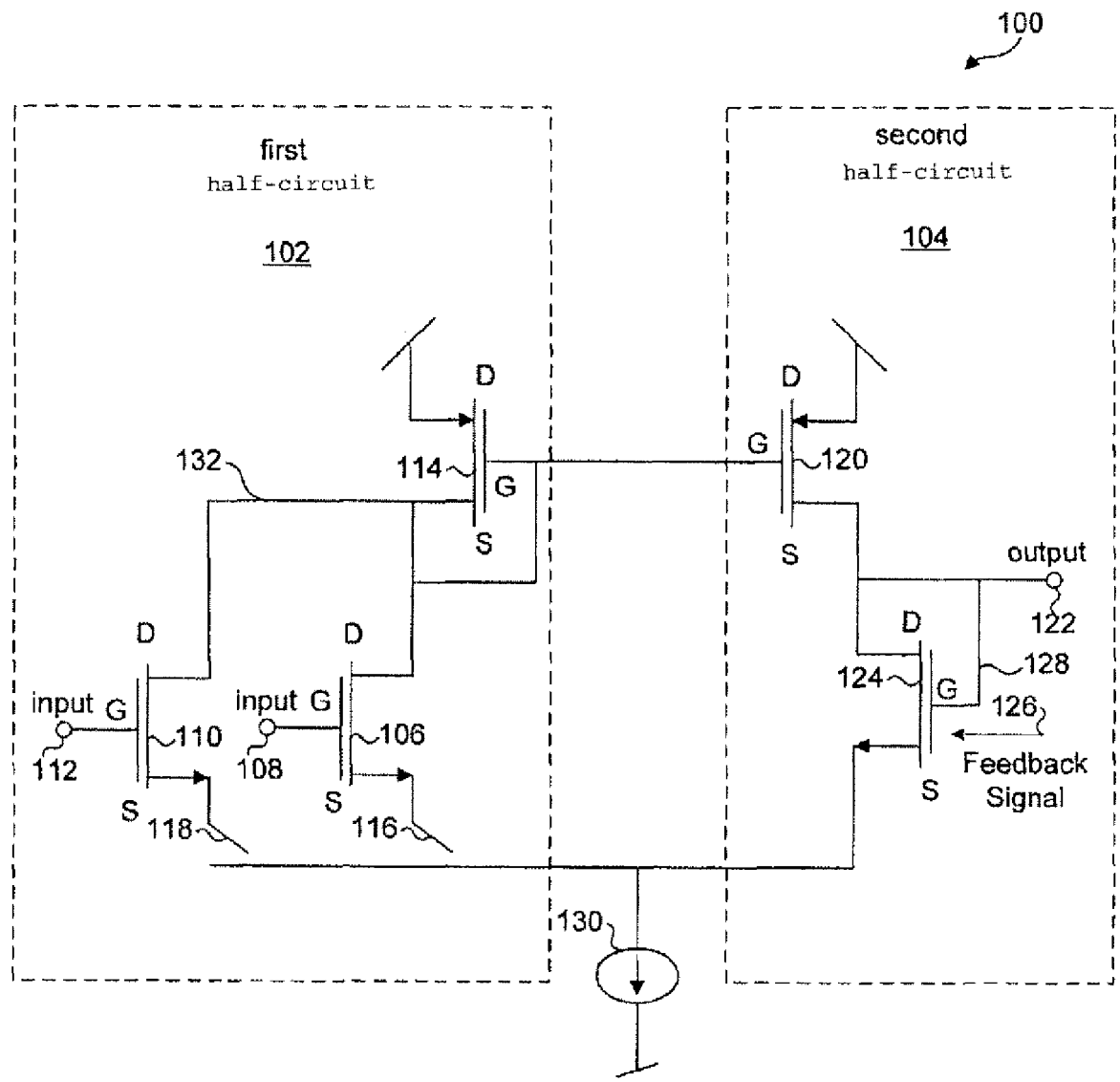
FIG. 1 is an electrical schematic of a differential readout circuit in accordance with at least one embodiment.

Referring to FIG. 1, a differential readout circuit 100 adapted to read from a matrix of addressable nodes is illustrated. A matrix of addressable nodes typically comprises one or more rows of nodes, and one or more columns of nodes. Thus, each node may be addressed at a corresponding location (x, y) of the matrix, where x refers to the row number, and y refers to the column number. Each addressable node represents one input to the readout circuit, such as a pixel representation signal (e.g., a voltage) from a photoconversion device of an imaging system. For example, an imaging system with a resolution of 640×480 may have a matrix of photoconversion devices with 640 columns and 480 rows. In another exemplary embodiment, the addressable nodes may comprise memory locations of a memory storage device.

Differential readout circuit 100 comprises a differential source follower source leader readout circuit having a first half-circuit 102 and a second half-circuit 104. The first half-circuit 102 includes at least one source follower transistor such as a first source follow transistor 106 adapted to receive an input signal from an addressable node 108 through its gate (G). Although understood and appreciated to be operable with a single first source follower transistor 106, in at least one embodiment, it is preferable, as illustrated, to have additional source follower transistors, such as second source follower transistor 110 adapted to receive an input signal from addressable node 112 through its gate (G). The first and second source follower transistors 106 and 110 receive a first channel current from a first source transistor 114 of the first half-circuit 102. As indicated, this first channel current may be a common first channel current, and source follower transistors 106 and 110 may share a common drain 132. The first half-circuit 102 further comprises at least one selector switch 116, 118 coupled to each source follower transistor 106, 110 adapted to selectively activate the source follower transistor 106, 110 to receive the input signal from addressable nodes 108 and 112, respectively through its respective gate (G).

The second half-circuit 104 includes a second source transistor 120 adapted to provide a second channel current, and an output node 122 adapted to provide an output signal of a readout of one of the addressable nodes 108, 112 provided in the first differential channel 102. Second source transistor 120 and the first source transistor 114 are coupled through their associated gates (G) as illustrated in FIG. 1. The second differential channel 104 through its gate (G) also includes a source leader transistor 124 coupled to the output node 122 adapted to provide a feedback signal 126 based on the readout of output node 122. The source leader transistor 124 is connected to a feedback loop 128 in electrical communication with the output node 122. Second source transistor 120 and first source transistor 114 provide equivalent currents to second half-circuit 104 and first half-circuit 102 when at least one of the source follower transistors 106 and 110 has an input signal.

In the illustrative embodiment of FIG. 1, the differential readout circuit 100 reads from one column of a matrix with two rows of addressable nodes 108, 112. Thus, a matrix of addressable nodes 108, 112 can be coupled to a plurality of differential readout circuits 100, each differential readout circuit 100 reading from one column of addressable nodes 108, 112 of the matrix. The illustrated matrix is a 1×2 matrix, but a matrix with any number of rows and columns can be utilized. For example, a 2×2 matrix could comprise two different differential readout circuits 100, each differential readout circuit 100 comprising one column of the matrix.

Figure 2:
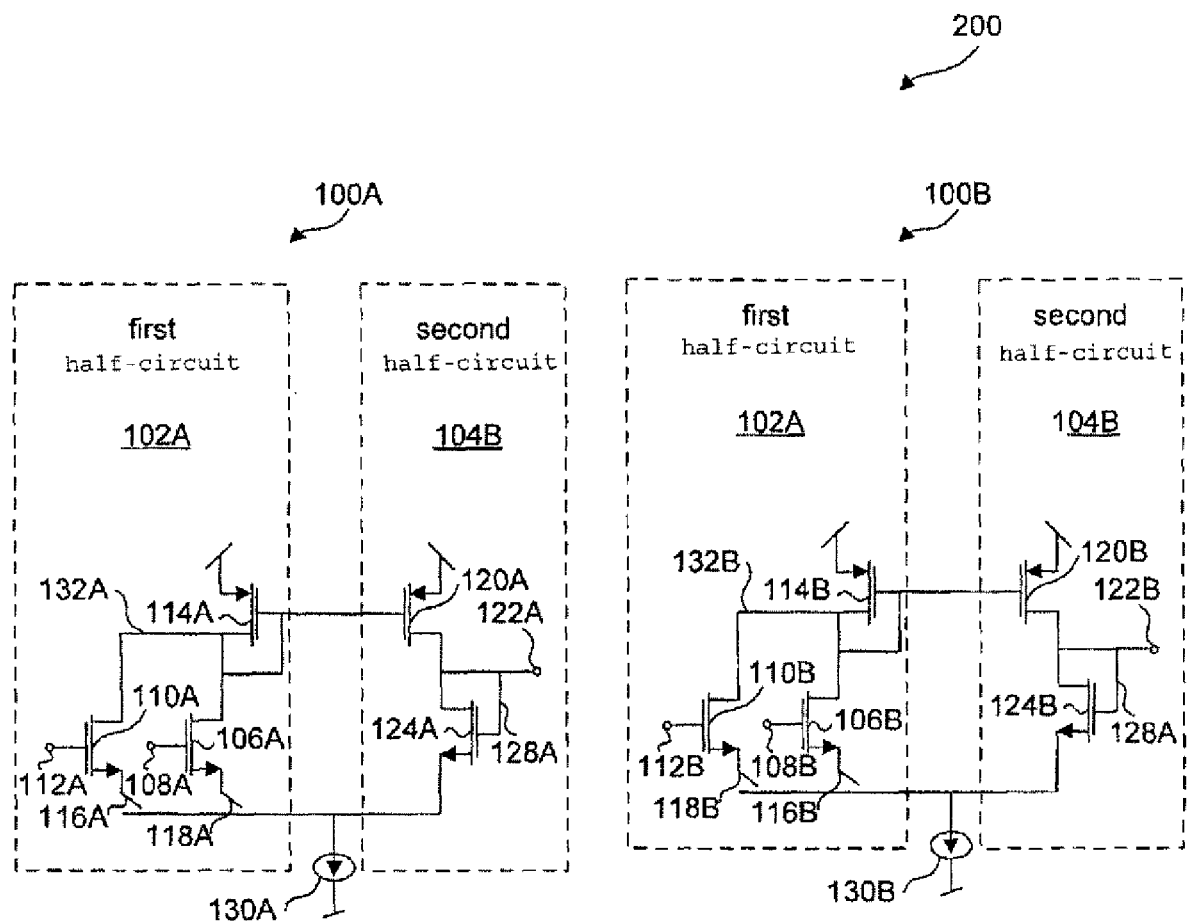
FIG. 2 illustrates a 2×2 cross-point array utilizing the differential readout circuit of FIG. 1 in an exemplary embodiment.

FIG. 2 illustrates a 2×2 cross-point array 200 utilizing differential readout circuit 100 of FIG. 1 in an exemplary embodiment. The illustrated embodiment comprises two differential readout circuits 100A and 100B. Differential readout circuits 100A and 100B each represent a single column of the matrix. Thus, addressable node 108A represents position 1, 1 of the matrix, and addressable node 112A represents position 2, 1 of the matrix. Likewise, addressable node 108B represents position 1, 2 of the matrix, and addressable node 112B represents position 2, 2 of the matrix.

For an imaging application, the number of rows and columns would typically correspond to the resolution of the imaging system (e.g., 640×480). An imaging system with a 640×480 resolution thus may comprise 480 differential readout circuits 100 (see FIG. 1), each readout circuit comprising one of the 480 columns of the pixel matrix. Likewise, each differential readout circuit 100 of the 640×480 matrix would comprise 640 sets of source transistors 106, addressable nodes 108 and row selector switches 116. A column selector switch (not shown) may then be provided for each differential readout circuit 100 to selectively activate differential readout circuit 100. Thus, a specific column (e.g., differential readout circuit 100A (see FIG. 2)) can be selectively activated, and each row of the column can be sampled sequentially.

Further, other configurations are possible, such that differential readout circuit 100 (see FIG. 1) may read from one row of addressable nodes 108, 112 of the matrix containing multiple columns of addressable nodes 108, 112. Thus, each row selector switch 116, 118 could correspond to particular columns rather than rows of the matrix. Through the utilization of multiplexers and other types of switches, differential readout circuit 100 may also be configured to read from any number of rows and/or columns.

In operation, a readout of a matrix is typically performed by selectively activating a differential readout circuit 100A (see FIG. 2) corresponding to a particular row, and then selectively activating each source follower transistor 106A and 110A corresponding to each row in some specified order. Thus, if addressable node 108A corresponds to position 1, 1 in the matrix, and addressable node 112A corresponds to position 2, 1 in the matrix, then the source follower transistors 106A and 110A may be selectively activated in that order, respectively. This process may then be repeated for additional differential readout circuit 100B of the matrix.

To read from a particular addressable node 108, 112, a voltage is generated at the first source transistor 114 and the second source transistor 120. Row selector switches 116, 118 are initially in an open position. A second source current (from second source transistor 120) flows through second differential channel 104, but no current flows through first differential channel 102 because row selector switches 116 and 118 are presently opened, providing no path for the first channel current. One of the source follower transistors 106, 110 is then selectively activated by closing its associated row selector switch 116, 118, creating a path for the first channel current from first source transistor 114. This allows a readout of one of the addressable nodes 108, 112.

As illustrated in FIG. 1, the source (S) of a selectively activated source follower transistor 106, 110 is connected to the source (S) of source leader transistor 124, and current flows to tail current source 130. Because differential readout circuit 100 has two input signals, one from an addressable node 108, 112 connected to the presently activated source follower transistor 106, 110, and one from feedback loop 128, a differential amplification is performed, and an output that is a difference between the input signal and the feedback signal is generated at output node 122. This signal cancels noise injected into the output signal by elements of differential readout circuit 100, and is known as common-mode rejection. Thus, through the utilization of common-mode rejection, noise in the output signal is reduced, such that the readout at output node 122 is improved over prior art readout circuits which do not provide common mode rejection. Advantageously, the signal noise in the readout is reduced, and the amplitude signal is higher than in prior art readout circuits.

To briefly restate, the differential readout circuit 100 comprises a first half-circuit 102 and a second half-circuit 104. The first half-circuit 102 comprises at least one source follower transistor 106, 110 adapted to receive an input signal through its gate from one of the addressable nodes, and a row selector switch coupled to the source follower transistor 106, 110 and adapted to selectively activate the source follower transistor 106, 110 to receive the input signal. The second half-circuit 104 comprises an output node 122 adapted to provide an output signal of a readout of one of the addressable nodes, and a source leader transistor 124 coupled to the output node 122 and adapted to provide a feedback signal based on the readout, the source leader transistor 124 connected to a feedback loop 128 in electrical communication with the output node 122.

Figure 3:
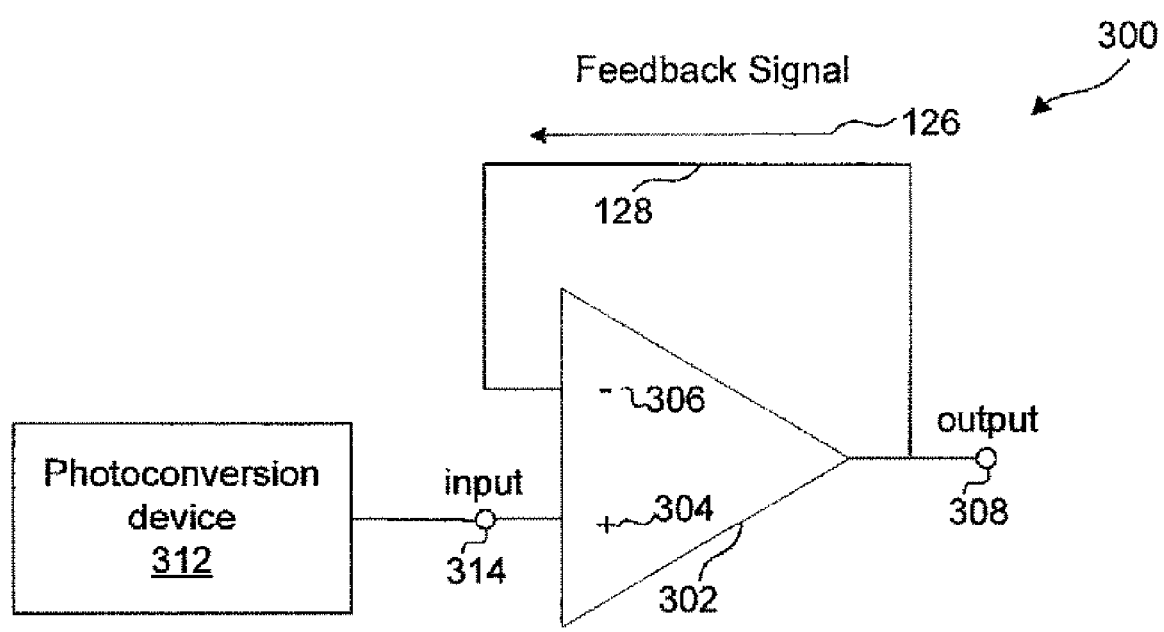
FIG. 3 illustrates a pixel readout circuit in accordance with at least one embodiment.

FIG. 3 illustrates a pixel readout circuit 300 in accordance with at least one embodiment. Pixel readout circuit 300 illustrates one gain configuration possible utilizing the differential readout circuit of FIG. 1. Pixel readout circuit 300 comprises a differential amplifier 302, with a first input 304 and a second input 306. The differential amplifier 302 may comprise any type of differential amplifier 302.

Moreover, in at least one embodiment, the differential amplifier 302 is a long tailed pair differential amplifier such as differential readout circuit 100. The long tailed differential amplifier would include a source follower transistor 106, 110 (see FIG. 1), a source leader transistor 124, a feedback loop 128, a first source transistor 114, a second source transistor 120 and a tail current source 130. If multiple source follower transistors were utilized, then the long-tailed differential amplifier may include one or more row selector switches 116, 118 for selectively activating source follower transistors 106, 110. A long-tailed differential amplifier may also include row selectors 116, 118 in other circumstances where selective activation of source follower transistors 106 and 110 is desired.

Referring back to FIG. 3, first input 304 of differential amplifier 302 is connected, by way of example, to a photoconversion device 312 through input node 314. However, it is to be understood that the input can be a voltage from other types of input devices without departing from the scope hereof Photoconversion device 312 may be any type of device adapted to accumulate a photo-generated charge responsive to light, such as a photogate, a photoconductor or a photodiode. The first input 304 of the differential amplifier 302 may comprise a source follower transistor (e.g., either of source follower transistors 106 or 110 of FIG. 1) having its gate (G) connected to the input node 314.

The second input 306 of the differential amplifier 302 is connected to a feedback loop 128 in electrical communication with an output node 308 of the differential amplifier 302. The second input node 306 may comprise a source leader transistor (e.g., source leader transistor 124 of FIG. 1) having its gate (G) connected to the feedback loop 128. Differential amplifier 302 receives an input signal from photoconversion device 312 and the feedback signal from output node 308, and generates a pixel readout from the difference between the feedback signal and the input signal.

Figure 4:
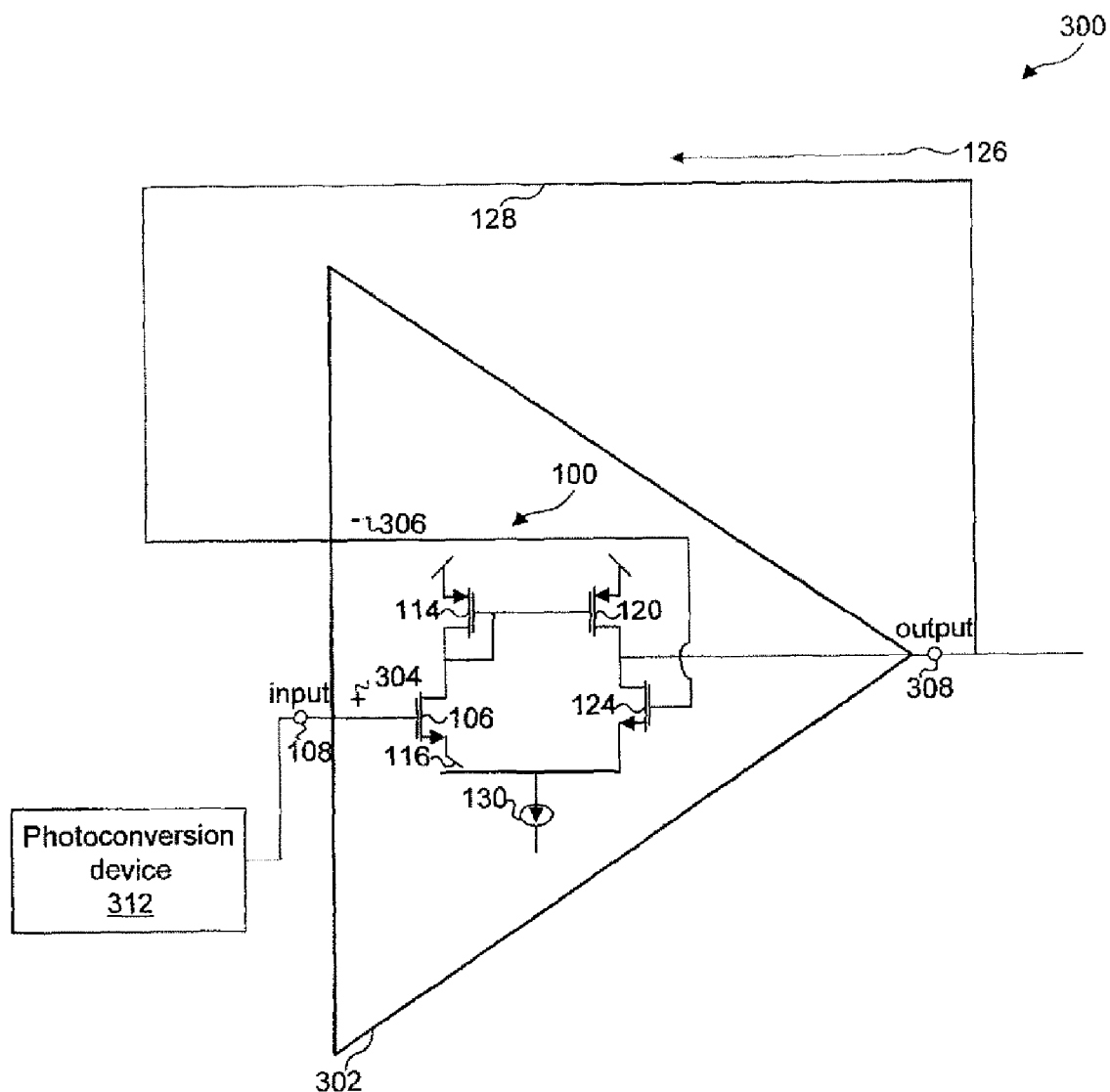
FIG. 4 illustrates the pixel readout circuit of FIG. 3 utilizing the differential readout circuit of FIG. 1 as its differential amplifier in an exemplary embodiment.

FIG. 4 illustrates pixel readout circuit 300 of FIG. 3 utilizing differential readout circuit 100 of FIG. 1 as its differential amplifier 302 in an exemplary embodiment. Photoconversion device 312 is connected to first source transistor 106. Thus, first input 304 of the differential amplifier 302 of FIGS. 3 and 4 corresponds to addressable node 108 of the differential readout circuit 100 of FIG. 1. Feedback loop 128 is connected to second input 306. Thus, differential amplifier 302 operates similarly to differential readout circuit 100, and provides similar common-mode rejection and improved pixel readout functionality.

To briefly restate, pixel readout circuit 300 comprises an input node 314 in electrical communication with a photoconversion device 312. Pixel readout circuit 300 further includes a differential amplifier 302 comprising a first input 304 in electrical communication with the input node 314, an output node 308 for providing a pixel readout of the photoconversion device 312, and a second input in electrical communication with a feedback loop 128 connected to the output node 308.

Figure 5:
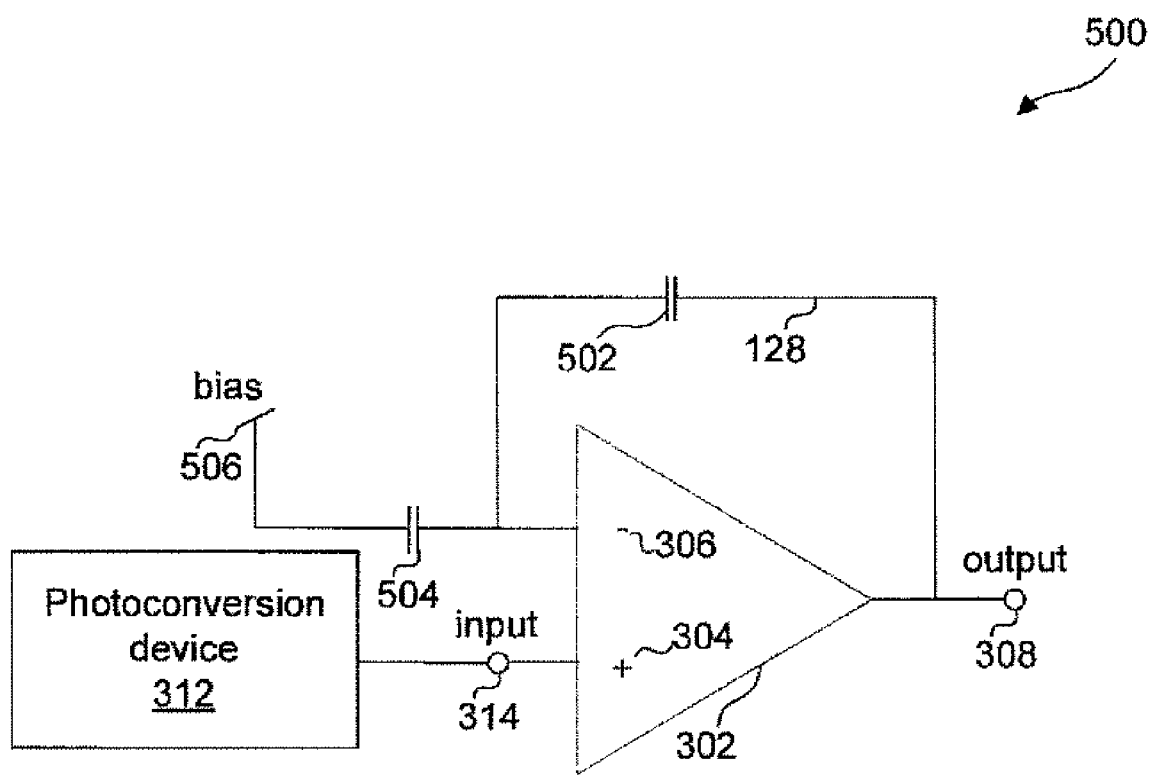
FIG. 5 illustrates another pixel readout circuit in accordance with at least one embodiment.

FIG. 5 illustrates a pixel readout circuit 500 in accordance with at least one embodiment. Pixel readout circuit 500 illustrates another gain configuration possible utilizing the differential readout circuit of FIG. 1. In the illustrative embodiment, pixel readout circuit 500 is connected to a capacitor gain network. Pixel readout circuit 500 includes elements common to pixel readout circuit 300, and their description is omitted herein for brevity. Feedback loop 128 of pixel readout circuit 500 comprises at least one first capacitor 502. The second input 306 of the differential amplifier 302 is further in electrical communication with at least one second capacitor 504 coupled to a bias source 506. This capacitor network can increase the gain of the circuit over the prior art and the embodiment of FIG. 3. As such, the pixel readout generated at output node 308 of pixel readout circuit 500 is of improved quality over those generated by prior art source follower transistors.

Figure 6:
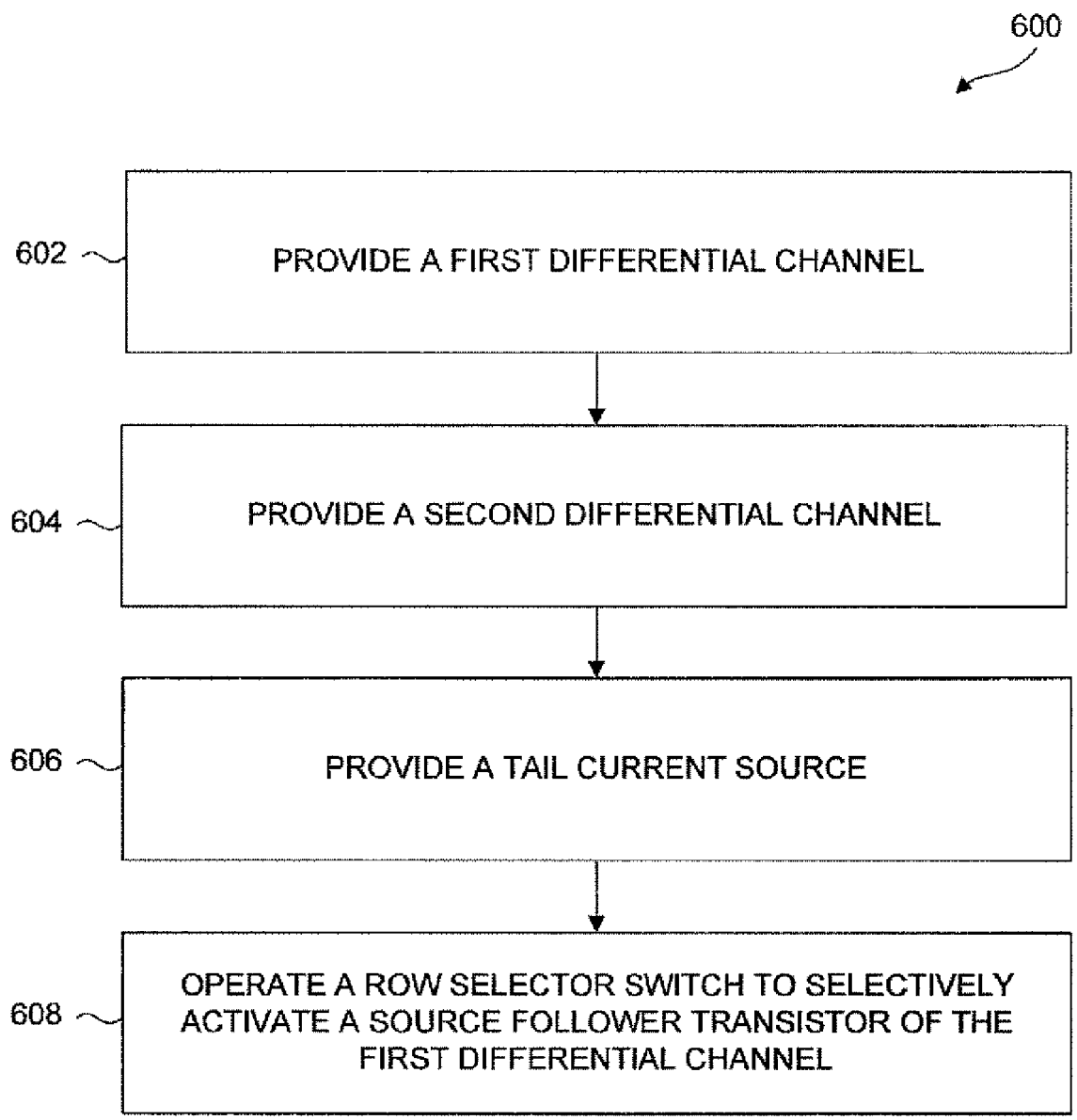
FIG. 6 is a block diagram illustrating steps in a method for reading from a matrix of addressable nodes in accordance with at least one embodiment.

FIG. 6 illustrates a method 600 in accordance with at least one embodiment for reading from a matrix of addressable nodes (such as photoconversion devices of an imaging system or memory locations of a memory storage device). It is also understood and appreciated that the disclosed method need not be performed in the order herein described, but that this order of description is exemplary of at least one embodiment and has been selected for ease of discussion and illustration.

The method 600 includes the steps of: providing a first half-circuit 102 comprising at least one source follower transistor 106, 112 adapted to receive an input signal from one of the addressable nodes 108, 112 (step 602), through its gate, providing a second half-circuit 104 comprising: an output node 122 adapted to provide an output signal of a readout of one of the addressable nodes 108, 112, and a source leader transistor 124 coupled to the output node 122 and adapted to provide a feedback signal based on the readout, the source leader transistor 124 connected to a feedback loop 128 in electrical communication with the output node 122 (step 604), providing a tail current source 130 in electrical communication with the source follower transistor 106, 112 and the source leader transistor 124 (step 606), and operating a row selector switch 116, 118 coupled to the source follower transistor 106, 112 to selectively activate the source follower transistor 106, 112 to receive the input signal (step 608).

Changes may be made in the above methods, systems and structures without departing from the scope hereof It should thus be noted that the matter contained in the above description and/or shown in the accompanying drawings should be interpreted as illustrative and not in a limiting sense. The following claims are intended to cover all generic and specific features described herein, as well as all statements of the scope of the present method, system and structure, which, as a matter of language, might be said to fall therebetween.

What is claimed is:

1. A readout circuit for reading from a matrix of addressable nodes comprising:
   a first half-circuit of a differential amplifier comprising:
      at least one source follower transistor adapted to receive an input signal from one of the addressable nodes; and
      at least one selector switch coupled to the source follower transistor and adapted to selectively activate the source follower transistor to receive the input signal; and
   a second half-circuit of a differential amplifier comprising:
      an output node adapted to provide an output signal of a readout of the one of the addressable nodes;
      a source leader transistor coupled to the output node and adapted to provide a feedback signal based on the readout of the one of the addressable nodes, the source leader transistor having a gate (G) connected to a feedback loop in electrical communication with the output node; and
      a tail current source selectively connected to the source follower transistor by the at least one selector switch and connected to the source leader transistor.

2. The readout circuit of claim 1, wherein the addressable nodes comprise pixel readouts of an imaging system.

3. The readout circuit of claim 1, wherein the addressable nodes comprise memory locations of a memory storage device.

4. The readout circuit of claim 1, wherein the first half-circuit further comprises a first source transistor adapted to provide a first channel current to the source follower transistor, and the second half-circuit further comprises a second source transistor adapted to provide a second channel current to the source leader transistor.

5. The readout circuit of claim 1, wherein the feedback loop comprises at least one first capacitor; and the source leader transistor is further in electrical communication with at least one second capacitor coupled to a bias source.

6. The readout circuit of claim 1, wherein the selector switch comprises a row selector switch.

7. The readout circuit of claim 1, wherein the selector switch comprises a column selector switch.

8. A readout circuit for reading from a matrix of addressable nodes comprising:
   a first half-circuit of a differential amplifier comprising:
      a plurality of source follower transistors, each source follower transistor adapted to receive an input signal from one of the addressable nodes;
      at least one selector switch coupled to each of the source follower transistors and adapted to selectively activate one of the source follower transistors to receive the input signal; and
   a second half-circuit of a differential amplifier comprising:
      an output node adapted to provide a readout of an output signal of a selected addressable node;
      a source leader transistor coupled to the output node and adapted to provide a feedback signal based on the readout of the selected addressable node, the source leader transistor having a gate (G) connected to a feedback loop in electrical communication with the output node; and
      a tail current source selectively connected to the source follower transistors by the at least one selector switch and connected to the source leader transistor.

9. The readout circuit of claim 8, wherein the addressable nodes comprise pixel readouts of an imaging system.

10. The readout circuit of claim 8, wherein the addressable nodes comprise memory locations of a memory storage device.

11. The readout circuit of claim 8, wherein the first half-circuit further comprises a first source transistor adapted to provide a first channel current to the source follower transistor, and the second half-circuit further comprises a second source transistor adapted to provide a second channel current to the source leader transistor.

12. The readout circuit of claim 8, wherein:
   the feedback loop comprises at least one first capacitor; and
   the source leader transistor is further in electrical communication with at least one second capacitor coupled to a bias source.

13. The readout circuit of claim 8, wherein the selector switch comprises a row selector switch.

14. The readout circuit of claim 8, wherein the selector switch comprises a column selector switch.

15. An imaging system comprising:
   a plurality of photoconversion devices each adapted to convert light into a pixel representation signal;
   a first half-circuit of a differential amplifier comprising:
      a first source transistor adapted to provide a first channel current; and
      a plurality of pixel readout circuits each comprising:
         a source follower transistor in electrical communication with one of the photoconversion devices and in electrical communication with the first source transistor, and adapted to receive the pixel representation signal from the one of the photoconversion devices; and
         at least one selector coupled to the source follower transistor and adapted to selectively activate the source follower transistor to receive the pixel representation signal and to provide a current path for the first channel current; and
   a second half-circuit of a differential amplifier comprising:
      a second source transistor adapted to provide a second channel current;
      an output node in electrical communication with the second source transistor and adapted to provide a pixel readout of the one of the photoconversion devices; and
      a source leader transistor coupled to the output node and adapted to provide a feedback signal based on the readout of the one of the photoconversion devices, the source leader transistor having a gate (G) connected to a feedback loop in electrical communication with the output node; and a tail current source selectively connected to the source follower transistor by the at least one selector and connected to the source leader transistor.

16. The imaging system of claim 15 further comprising a plurality of pairs of the first half-circuit and the second half-circuit, each of the pairs of the first half-circuit and the second half-circuit of a differential amplifier comprising a column of pixels.

17. The imaging system of claim 15, wherein the source follower transistor of each of the plurality of pixel readout circuits share a common drain.

18. The imaging system of claim 15, wherein:

the feedback loop comprises at least one first capacitor; and the source leader transistor is further in electrical communication with at least one second capacitor coupled to a bias source.

19. A method for reading from a matrix of addressable nodes comprising the steps of:

providing half-circuit of a differential amplifier, the half circuit comprising at least one source follower transistor adapted to receive an input signal from one of the addressable nodes; and providing a second half-circuit of a differential amplifier, the half circuit comprising:

an output node adapted to provide an output signal of a readout of the one of the addressable nodes; and a source leader transistor coupled to the output node and adapted to provide a feedback signal based on the readout of the one of the addressable nodes, the source leader transistor having a gate (G) connected to a feedback loop in electrical communication with the output node; and providing a tail current source selectively connected to the source follower transistor by a selector switch and connected to the source leader transistor; and operating the selector switch by coupling to the source follower transistor to selectively activate the source follower transistor to receive the input signal.

20. The method of claim 19, wherein the addressable nodes comprise pixel readouts of an imaging system.

21. The method of claim 19, wherein the addressable nodes comprise memory locations of a memory storage device.

\* \* \* \* \*